United States Patent [19]

Michaud

[11] Patent Number: 5,604,657
[45] Date of Patent: Feb. 18, 1997

[54] RELAY CIRCUIT HAVING A TEST SWITCH AND METHOD OF TESTING A RELAY CIRCUIT

[75] Inventor: Roger P. Michaud, Orrs Island, Me.

[73] Assignee: Erie Manufacturing Company, Milwaukee, Wis.

[21] Appl. No.: 329,424

[22] Filed: Oct. 27, 1994

[51] Int. Cl.⁶ .................................................. H01H 47/00
[52] U.S. Cl. .................................................. 361/189; 361/170
[58] Field of Search .................................. 361/170, 189, 361/190; 324/418, 417; 307/115, 117, 134; 340/644

[56] References Cited

U.S. PATENT DOCUMENTS

| | | |
|---|---|---|
| 1,570,416 | 1/1926 | Vassar . |
| 3,058,663 | 10/1962 | Barnard . |
| 4,338,649 | 7/1982 | Mosier . |
| 4,879,437 | 11/1989 | Dard et al. ................. 361/211 X |
| 5,018,043 | 5/1991 | Moreau ....................... 361/187 |

*Primary Examiner*—Jeffrey A. Gaffin
*Attorney, Agent, or Firm*—Finnegan, Henderson, Farabow, Garrett & Dunner, L.L.P.

[57] ABSTRACT

A relay circuit for energizing a load in response to a control device and method of testing the relay circuit, in which a switch is provided for selectively disconnecting the control device from the relay circuit and activating a relay switch such that the load is energized when in a test mode and reconnecting the control device when in an operational mode. By disconnecting the control device in the test mode, the control device may be electrically isolated from the relay circuit thereby protecting the control device from damage due to backfeeding.

15 Claims, 2 Drawing Sheets

RELAY CIRCUIT HAVING A TEST SWITCH AND METHOD OF TESTING A RELAY CIRCUIT

BACKGROUND OF THE INVENTION

1. Field of the Invention

The present invention relates to a relay circuit and a method of testing a relay circuit. More particularly, the present invention relates to a relay circuit for controlling a load in response to a control device, where the relay circuit has a test switch for testing the relay circuit while isolating the control device.

2. Discussion of the Related Art

FIG. 1 shows a conventional relay circuit 10 connected to a load device 60 and a control device 70. Conventional relay circuit 10 includes a transformer 20 having four terminals, a relay switch 30, and a resistor 40. A coil 35 of relay switch 30 and resistor 40 are connected in parallel with one common node connected to a first terminal 21 of transformer 20, and the other node connected to a terminal 51. The conventional relay circuit shown in FIG. 1 is provided on a circuit board and terminals 22, 51, 52, and 53 are also provided on the circuit board to allow external components to be connected. For example, a load device 60, such as a hot water heater, heating/air conditioning equipment, circulator, oil burner, gas valve, or any other line voltage load, may be connected to load terminals 52 and 53, while a control device 70 such as a thermostat may be connected to terminals 22 and 51. Terminals 23, 24, 54, and 55 are provided on the circuit board to provide connection to a power supply, such as a commercial 120 V AC power supply. Terminal 56 may optionally be provided to connect a second load device that operates whenever the first load device 60 is not operating.

In normal operation, control device 70 will provide a closed circuit across terminals 22 and 51 thereby causing relay coil 35 to close relay switch 30 across terminals 31 and 32 and causing power to be delivered to load device 60 in order to cause load device 60 to turn on. Similarly, control device 70 will provide an open circuit between terminals 22 and 51 thereby causing relay switch 30 to interrupt the power supplied to load device 60 in order to cause load device 60 to turn off.

When a system failure is detected, one must be able to individually test the components of the system. Because relay circuits, such as that shown in FIG. 1, are prone to failure, one must be able to test the operability of the relay circuit to determine whether relay circuit 10 has failed or control device 70 has failed. Typically, one would test the operability of relay circuit 10 by shorting across terminals 22 and 51. If load device 60 turns on when terminals 22 and 51 are short-circuited, one may conclude that relay circuit 10 is operational and the failure is caused by control device 70. On the other hand, if load device 60 does not turn on, one may conclude that the failure is caused by relay circuit 10 or load device 60.

Because control devices, particularly electronic thermostats, are prone to damage resulting from backfeeding, the above described method of testing the relay circuit subjects the control device to damage.

SUMMARY OF THE INVENTION

Accordingly, the present invention has been made in view of the above circumstances and has as an object to provide a relay circuit having a switch for testing the relay circuit while electrically isolating a control device to prevent damage to the control device caused by backfeeding.

Additional objects and advantages of the invention will be set forth in part in the description which follows and in part will be apparent from the description, or may be learned by practice of the invention. The objects and advantages of the invention may be realized and attained by means of the instrumentalities and combinations particularly pointed out in the written description and claims hereof as well as the appended drawings.

To achieve these and other objects and advantages and in accordance with the purpose of the invention, as embodied and broadly described herein, the relay circuit of this invention, which controls a load in response to a control device, comprises a relay switch provided in a power supply line to the load, the relay switch including a relay coil having a first terminal, which is connected to a first power supply terminal, and a second terminal; and a switch having a first terminal connected to the second terminal of the relay coil, a second terminal connected to a second power supply terminal, and a third terminal connected to the control device, wherein the switch selectively connects the second terminal of the relay coil with the control device when the relay circuit is in an operating mode, and selectively connects the second terminal of the relay coil with the second power supply terminal while disconnecting the control device from the relay circuit when the relay circuit is in a test mode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate one embodiment of the invention and, together with the description, serve to explain the objects, advantages, and principles of the invention. In the drawings.

DETAILED DESCRIPTION OF THE PREFERRED EMBODIMENTS

Reference will now be made in detail to the present preferred embodiment of the invention, an example of which is illustrated in the accompanying drawing.

Figure 1:
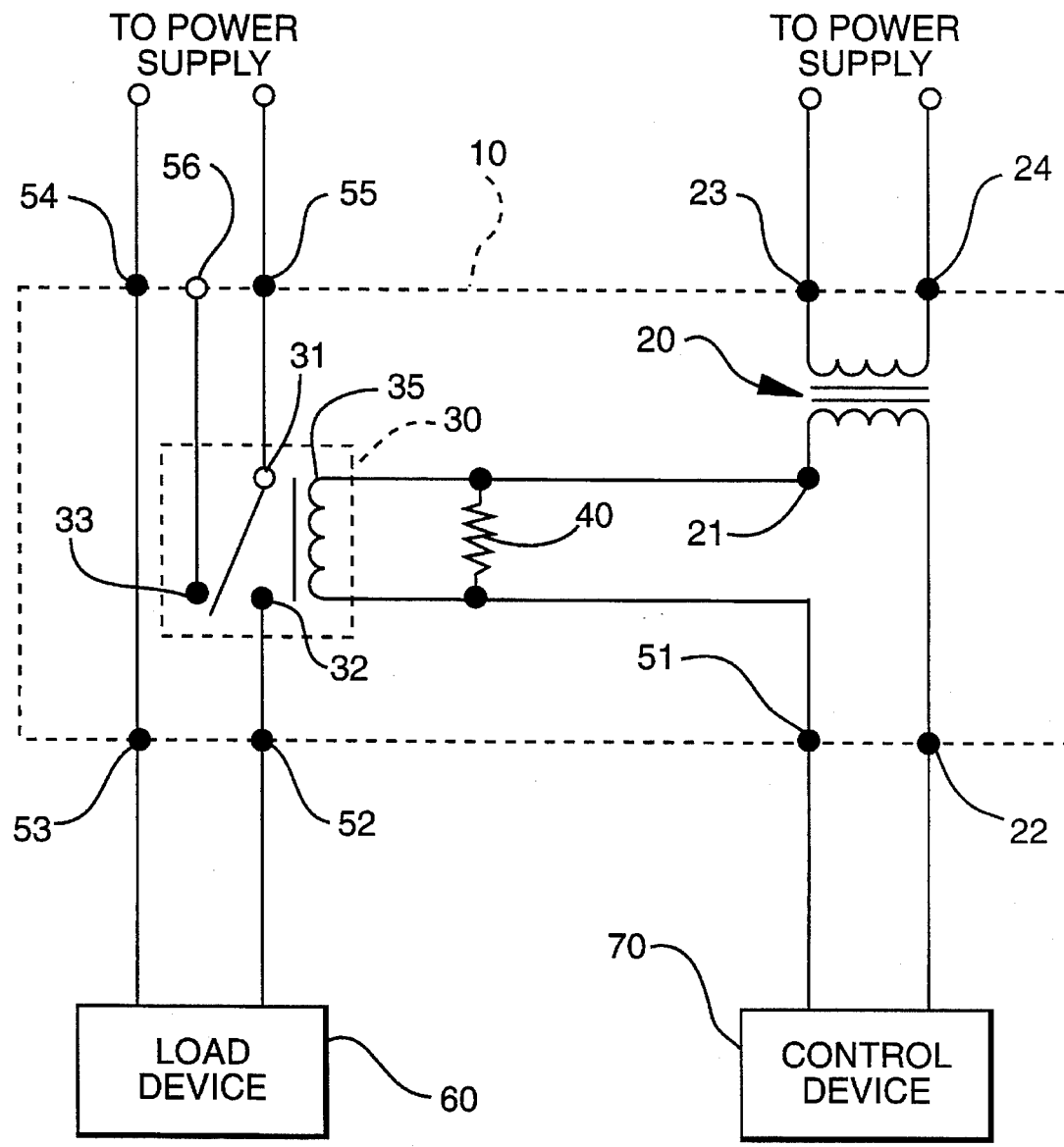
FIG. 1 is a schematic illustration of a conventional relay circuit.
Figure 2:
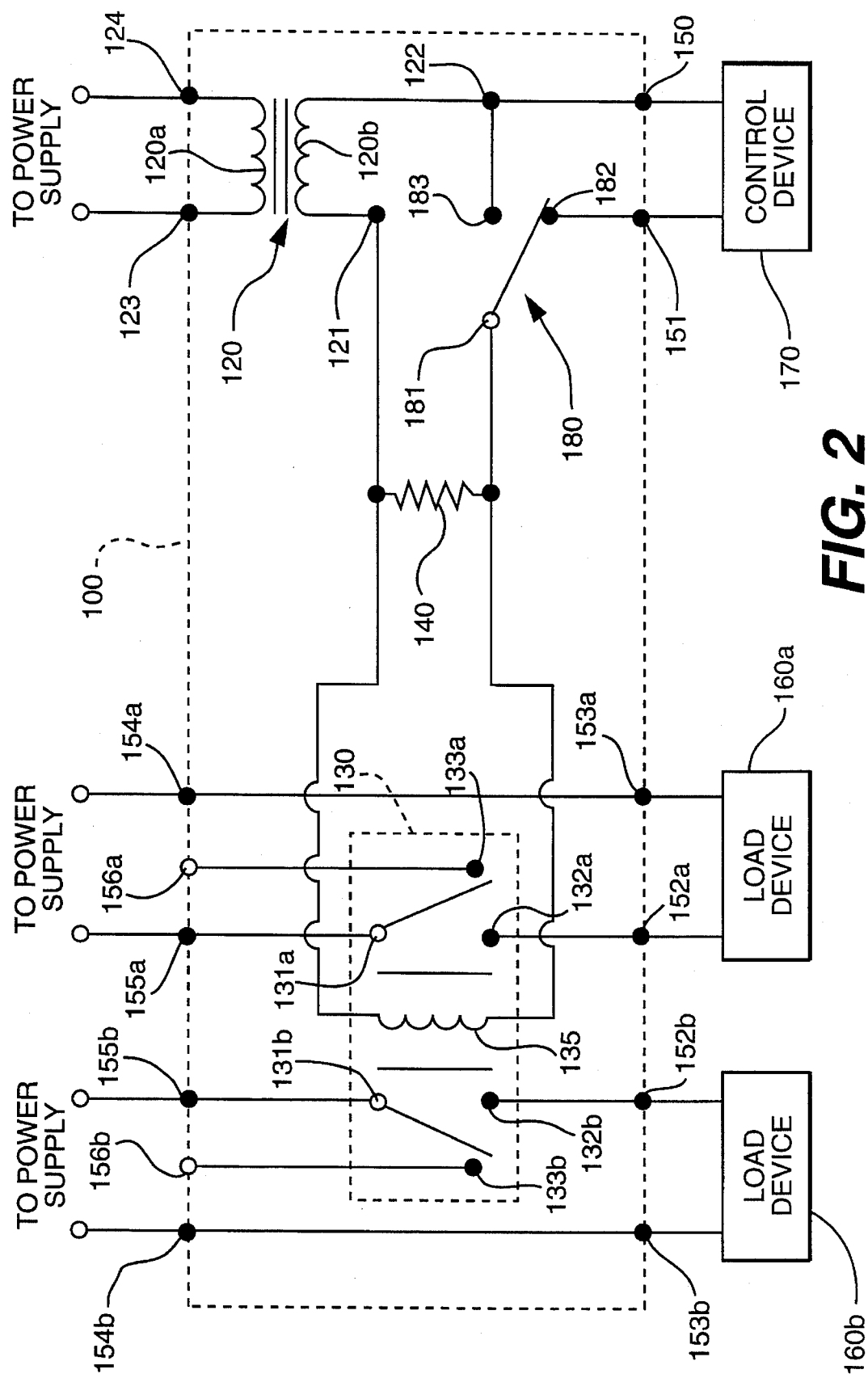
FIG. 2 is a schematic illustration of a relay circuit constructed in accordance with the preferred embodiment of the present invention.

The exemplary embodiment of the relay circuit of the present invention is shown in FIG. 2 and is designated generally by the reference numeral 100.

Relay circuit 100 includes a transformer 120 having four terminals including terminals 121 and 122 of a secondary winding 120b and terminals 123 and 124 of a primary winding 120a, a relay switch 130, a resistor 140, and a switch 180 having three terminals 181, 182, and 183. A relay coil 135 of relay switch 130 and resistor 140 are connected in parallel with one common node connected to the first secondary winding terminal 121 of transformer 120, and the other common node connected to a movable contact terminal 181 of switch 180. Terminal 183 of switch 180 is connected to second secondary winding terminal 122 of transformer 120.

Relay circuit 100 is preferably provided on a circuit board and terminals 123 and 124 are provided on the circuit board to connect the primary winding 120a of transformer 120 to a power supply, such as a commercial 120 V AC power supply. Terminals 154a, 154b, 155a, and 155b are provided for connection to a power supply, which is preferably the same commercial power supply that supplies the primary winding of transformer 120. Terminals 150, 151, 152a, 152b, 153a, and 153b are provided on the circuit board to allow external components to be connected. For example, a first load device 160a, such as a hot water heater, heating/air conditioning equipment, circulator, oil burner, gas valve, or any other line voltage load, may be connected to load terminals 152a and 153a, while a control device 170, such as a thermostat, may be connected to control terminals 150 and 151. Control terminal 150 provides a connection to second secondary winding terminal 122 of transformer 120, and control terminal 151 is connected to terminal 182 of switch 180. Load terminals 152a and 152b are connected to terminals 132a and 132b, respectively, of relay switch 130, and load terminals 153a and 153b are directly connected to power supply terminals 154a and 154b, respectively. Terminals 156a and 156b, which are respectively connected to terminals 133a and 133b of relay switch 130, may optionally be provided to connect additional load devices that operate whenever first load device 160a and an optional and second load device 160b are not operating.

Relay switch 130 may be a commercially available relay, such as a NLDX2 motor controller component type SCL-DPDT manufactured by Song Chuan Precision Company, Ltd. A commercially available transformer 120 suitable for use in the present invention is a class 2 transformer, type BE110910GBB manufactured by Basler Electric. Resistor 140 preferably has a resistance between 430 and 510 ohms and is rated at 5 W.

In normal operation, control device 170 will provide a closed circuit across control terminals 150 and 151 thereby causing normally open relay switch 130 to close across terminals 131a and 132a (and across terminals 131b and 132b) and causing power to be delivered to energize first load device 160a while switch 180 is in its illustrated position. Similarly, control device 170 will provide an open circuit between control terminals 150 and 151, thereby causing relay switch 130 to interrupt the power supplied to first load device 160a.

Switch 180 preferably comprises a single-pole double-throw switch provided on the circuit board to selectively connect the second common node of resistor 140 and relay switch 130 with either control terminal 151, via terminal 182, or with second secondary winding terminal 122 of transformer 120, via terminal 183. When switch 180 connects the second common node to control terminal 151, relay circuit 100 operates in the manner described above. However, when switch 180 connects the second common node to second secondary winding terminal 122 of transformer 120, relay circuit 100 becomes a closed circuit causing the load device(s) to turn on. At the same time, switch 180 disconnects control device 170 from relay circuit 100.

By providing switch 180 in relay circuit 100, one may test relay circuit 100 in isolation from control device 170, making trouble shooting easier. Further, by automatically disconnecting control device 170 from relay circuit 100 during testing, the present invention prevents damage to control device 170 caused by backfeeding. As stated above, electronic thermostats are particularly prone to damage resulting from backfeeding. Moreover, backfeeding also affects conventional thermostats by damaging the heating anticipator circuit. Thus, the present invention is particularly advantageous when utilized with an electronic or conventional thermostat or other control devices particularly prone to damage resulting from backfeeding.

Although the preferred embodiment of the present invention has been described as controlling a single load device when the relay switch is closed, a second load device 160b may also be controllably turned on simultaneously with first load device 160a. Such an arrangement may be desirable when first load device 160a is a circulator of a hot water heater and second load device 160b is a burner of the same hot water heater.

The foregoing description of the preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A relay circuit for controlling a load in response to a control device, the relay circuit comprising:

a relay switch provided in a power supply line to the load, said relay switch including a relay coil having a first terminal connected to a first power supply terminal, and a second terminal; and a switch having a first terminal connected to said second terminal of said relay coil, a second terminal connected to a second power supply terminal, and a third terminal connected to a first terminal of the control device, the second power supply terminal being connected to a second terminal of the control device, wherein said switch selectively connects said second terminal of said relay coil with the control device when the relay circuit is in an operating mode, and selectively connects said second terminal of said relay coil with said second power supply terminal while disconnecting the control device from the relay circuit when the relay circuit is in a test mode.

2. The relay circuit of claim 1, wherein the control device comprises a thermostat, and the load comprises a hot water heater.

3. The relay circuit of claim 1, wherein the load comprises a circulator.

4. The relay circuit of claim 1, wherein the load comprises an oil burner.

5. The relay circuit of claim 1, wherein the load comprises a gas valve.

6. The relay circuit of claim 1, wherein said switch comprises a single-pole double-throw switch.

7. The relay circuit of claim 1, further comprising a transformer having first and second primary winding terminals for connecting the transformer to a power source, and first and second secondary winding terminals.

8. The relay circuit of claim 7, wherein the control device includes two control terminals, a first control terminal to which said third terminal of said switch is connected, and a second control terminal connected to said second secondary winding terminal of said transformer.

9. A relay circuit for controlling a load in response to a control device, the relay circuit comprising:

a relay switch provided in a power supply line to the load, said relay switch including a relay coil having a first terminal, which is connected to a first power supply terminal, and a second terminal;

a transformer having first and second primary winding terminals for connecting the transformer to a power supply, a first secondary winding terminal connected to said first terminal of said relay coil, and a second secondary winding terminal connected to a first terminal of the control device; and selecting means for electrically isolating the control device from the relay circuit and energizing the load when the relay circuit is in a test mode and for electrically connecting the control device into the relay circuit during an operational mode when energization of the load is controlled by the control device, the selecting means having first, second, and third terminals, the first selecting means terminal being connected to the second terminal of the relay switch, the second selecting means terminal being connected to the first terminal of the control device, and the third selecting means terminal being connected to a second terminal of the control device.

10. The relay circuit of claim 9, wherein the control device comprises a thermostat, and the load comprises a hot water heater.

11. The relay circuit of claim 9, wherein the load comprises a circulator.

12. The relay circuit of claim 9, wherein the load comprises an oil burner.

13. The relay circuit of claim 9, wherein the load comprises a gas valve.

14. The relay circuit of claim 9, wherein said switch comprises a single-pole double-throw switch.

15. The method for operating a relay circuit connected to a load and a control device, the relay circuit including a relay switch positioned in a power supply line to the load, said switch having a relay coil serially coupled to the control device, said series-coupled relay coil and control device being connected across first and second power supply terminals, the method comprising the steps of:

providing a switch for selectively connecting a first terminal of the relay coil with either a first terminal or a second terminal of the control device, while maintaining a connection between a second terminal of the relay coil and the first power supply terminal; and operating the switch to a first position to electrically isolate the control device from the relay circuit by disconnecting the control device from the first terminal of the relay coil and to energize the load by connecting the first terminal of the relay coil with the second power supply terminal and the second terminal of the control device, and operating the switch to a second position to electrically connect the control device into the relay circuit, such that energization of the load is controlled by the control device.

* * * * *